United States Patent
Estrada et al.

(10) Patent No.: US 10,971,661 B2
(45) Date of Patent: Apr. 6, 2021

(54) LIGHT-EMITTING DEVICE WITH LIGHT SCATTER TUNING TO CONTROL COLOR SHIFT

(71) Applicant: LUMILEDS LLC, San Jose, CA (US)

(72) Inventors: Daniel Estrada, Santa Cruz, CA (US); Marcel Rene Bohmer, Eindhoven (NL); Jacobus Johannes Francisus Gerardus Heuts, Eindhoven (NL); Kentaro Shimizu, Sunnyvale, CA (US); Michael David Camras, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/997,338

(22) Filed: Aug. 19, 2020

(65) Prior Publication Data

US 2020/0381598 A1   Dec. 3, 2020

Related U.S. Application Data

(63) Continuation of application No. 16/048,436, filed on Jul. 30, 2018, now Pat. No. 10,756,242.

(51) Int. Cl.
| | |
|---|---|
| H01L 33/50 | (2010.01) |
| H01L 33/62 | (2010.01) |
| H01L 33/56 | (2010.01) |

(52) U.S. Cl.
CPC .......... *H01L 33/504* (2013.01); *H01L 33/505* (2013.01); *H01L 33/507* (2013.01);
(Continued)

(58) Field of Classification Search
CPC ........... H01L 33/504; H01L 2933/0091; H01L 33/505; H01L 33/507; H01L 33/56; H01L 33/58
See application file for complete search history.

(56) References Cited

U.S. PATENT DOCUMENTS

| 7,902,566 B2 | 3/2011 | Paolini et al. |
| 9,620,486 B2 | 4/2017 | Windisch et al. |
| (Continued) | | |

FOREIGN PATENT DOCUMENTS

EP   2645433 A2   10/2013

OTHER PUBLICATIONS

International Search Report corresponding to PCT/US2019/044096, dated Dec. 5, 2019, 3 pages.

(Continued)

*Primary Examiner* — Zandra V Smith
*Assistant Examiner* — Molly K Reida

(57) ABSTRACT

A system and methods for light-emitting diode (LED) devices with a dimming feature that can tailor a color point shift in the light color temperature of a scattering/transparent layer to enlarge a dim to warm range are disclosed herein. A light-emitting device may include a wavelength converting structure configured to receive light from a light emitting semiconductor structure and an adjacent light scattering structure. The light scattering structure may comprise a plurality of scattering particles with a lower refractive index (RI) than the RI of the matrix material in which the scattering particles are disposed. The wavelength converting structure may include a red phosphor and a green phosphor such that to adjust overlap between green emission and absorption by the red phosphor to correspondingly adjust scattering and magnitude of color shift. In an embodiment, the light scattering structure may be integrated in the wavelength converting structure.

20 Claims, 5 Drawing Sheets

(52) U.S. Cl.
CPC .............. *H01L 33/56* (2013.01); *H01L 33/62* (2013.01); *H01L 2933/005* (2013.01); *H01L 2933/0041* (2013.01); *H01L 2933/0091* (2013.01)

(56) References Cited

U.S. PATENT DOCUMENTS

| | | |
|---|---|---|
| 2002/0030194 A1 | 3/2002 | Camras et al. |
| 2002/0180351 A1 | 12/2002 | McNulty et al. |
| 2005/0173708 A1 | 8/2005 | Suehiro et al. |
| 2009/0057699 A1 | 3/2009 | Basin et al. |
| 2011/0062469 A1 | 3/2011 | Camras et al. |
| 2011/0227477 A1 | 9/2011 | Zhang et al. |
| 2012/0001204 A1 | 1/2012 | Jagt |
| 2013/0207148 A1 | 8/2013 | Krauter et al. |
| 2013/0264937 A1 | 10/2013 | Sakuta et al. |
| 2014/0125898 A1 | 5/2014 | Chao et al. |
| 2016/0163931 A1 | 6/2016 | Schricker et al. |
| 2016/0260873 A1 | 9/2016 | Yamada et al. |
| 2017/0104140 A1 | 4/2017 | Gaska et al. |
| 2017/0294562 A1 | 10/2017 | Tsuji |
| 2018/0053882 A1 | 2/2018 | Cheng et al. |
| 2018/0062052 A1 | 3/2018 | Bohmer et al. |
| 2018/0097158 A1 | 4/2018 | Estrada et al. |
| 2018/0122993 A1 | 5/2018 | Camras et al. |
| 2018/0362844 A1 | 12/2018 | Chiang et al. |

OTHER PUBLICATIONS

Written Opinion of the International Searching Authority corresponding to PCT/US2019/044096, dated Dec. 5, 2019, 6 pages.
Pust et al., Narrow-band red-emitting Sr[LiAl3N4]:Eu2+ as a next generation LED-phosphor material, Nature Materials, vol. 13, Sep. 2014 pp. 891-896. (Year 2014).
Zhang et al., "Phosphor Deposits of β-Sialon:Eu2+Mixed withSnO2 Nanoparticles Fabricated by the Electrophoretic Deposition (EPD) Process,"Materials 2014, 7, 3623-3633 (May 6, 2014).
European Search Report corresponding to EP 18 20 0747, Feb. 6, 2019, 9 pages.

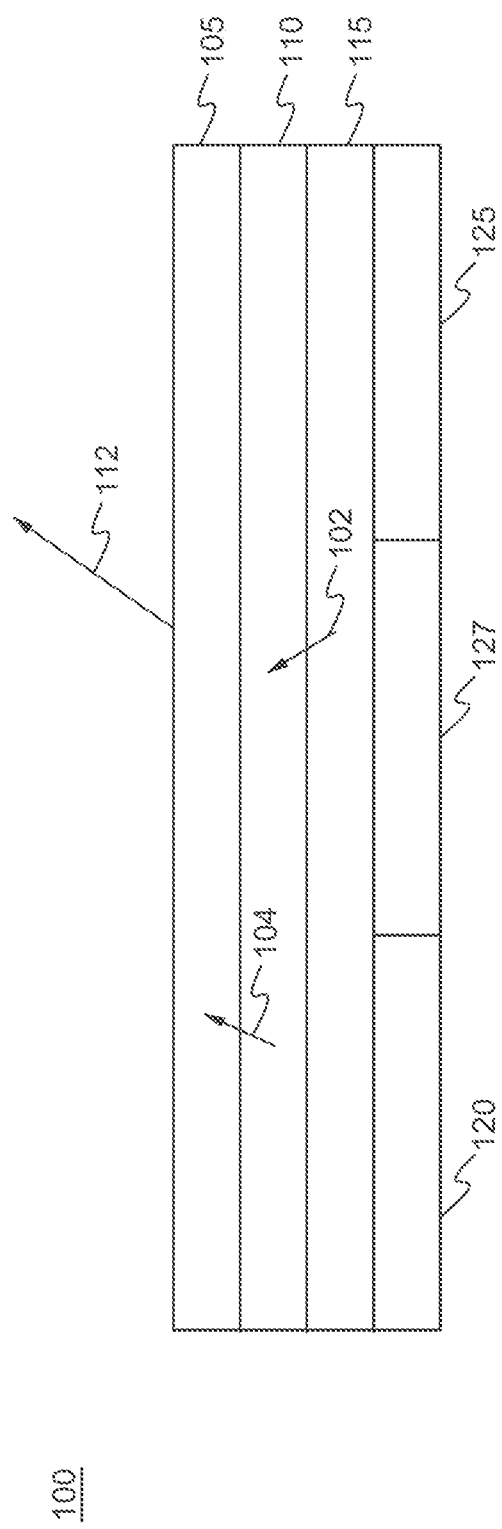
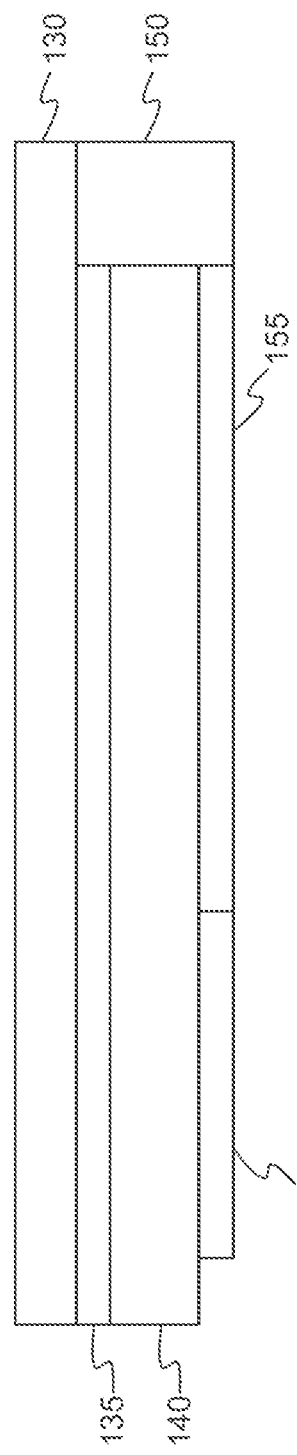
FIG. 1A
FIG. 1B

LIGHT-EMITTING DEVICE WITH LIGHT SCATTER TUNING TO CONTROL COLOR SHIFT

CROSS-REFERENCE TO RELATED APPLICATIONS

The present application is a continuation of U.S. application Ser. No. 16/048,436 filed Jul. 30, 2018. The patent application listed above is incorporated herein by reference in its entirety.

FIELD OF INVENTION

This disclosure generally relates to light-emitting illumination devices, and more particularly to system and methods for light-emitting diodes (LEDs) with a dimming feature that can tailor a color point shift and change in color temperature with a scattering/transparent layer or structure to provide a light dimming effect and enhance dimming range.

BACKGROUND

Light emitting diodes (LEDs) are used as sources of light for a variety of applications. For example, LEDs may be used as white light sources in various applications, such as flash sources for cellular telephone cameras and filament lamps. Such LEDs may be referred to herein as white LEDs or white-appearing LEDs. White LEDs may appear to emit white light from the perspective of the viewer when the LEDs are in an on state. In some cases, the white LEDs may be made up of light emitting semiconductor structures that emit non-white light as well as wavelength converting structures that make the non-white light appear white to the viewer. For example, a white LED may be formed from a blue light emitting semiconductor structure covered by a yellow emitting phosphor layer (i.e., the wavelength converting structure), and may be referred to as a phosphor-converted LED (pc-LED). Photons of blue light emitted by the light emitting semiconductor structure may either pass through the yellow emitting phosphor layer as blue photons or may be converted into yellow photons by the yellow emitting phosphor layer. The blue and yellow photons that are ultimately emitted out of the LED combine to make the light emitted from the LED appear white to the viewer.

SUMMARY

A system and methods for light-emitting diode (LED) devices with a dimming feature that can tailor a color point shift and change in color temperature with a scattering/transparent layer or structure to provide a light dimming effect and enlarge a dimming range are disclosed herein. A light-emitting device may include a light emitting semiconductor structure configured to emit a light in an on state. The light-emitting device may further include a wavelength converting structure, having a first surface adjacent to the light emitting semiconductor structure and a second surface opposite the first surface, configured to receive the light emitted by the light emitting semiconductor structure and reflected light from a light scattering structure. The light scattering structure may be adjacent to the second surface of the wavelength converting material, and may comprise a plurality of scattering particles disposed in a first matrix material with a first refractive index (RI). Alternatively, the light scattering may be included in the wavelength converting structure. Each of the plurality of scattering particles may comprise a material with a second RI that is lower than the first RI. The wavelength converting structure may comprise at least a first plurality of phosphor particles of a first type of phosphor and a second plurality of phosphor particles of a second type of phosphor disposed in a second matrix material. The first type of phosphor may absorb a first spectrum of light and emit a second spectrum of the light. The second type of phosphor may emit the second spectrum of light such that an excitation (or absorption) spectrum of the first type of phosphor overlaps with an emission spectrum of the second type of phosphor, where a greater overlap results in a larger color point shift in the light emitted from the light-emitting device as a function of temperature and drive current.

BRIEF DESCRIPTION OF THE DRAWINGS

FIG. 1A is a diagram of an example light-emitting device that includes a light emitting semiconductor structure, a wavelength converting structure, and an light scattering structure;

FIG. 1B is a diagram of an example light emitting semiconductor structure 115 that may be included in the light-emitting device of FIG. 1A;

DETAILED DESCRIPTION OF THE EMBODIMENTS

Figure 1C:
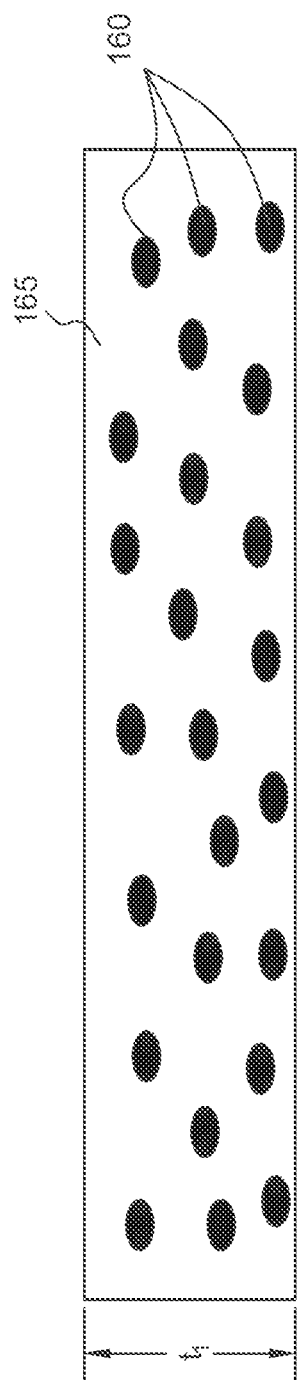
FIG. 1C is a diagram of an example layer of scattering structure that may be included in the light-emitting device of FIG. 1A.

Adding a dimming effect to an LED, such as a white-appearing LED, permits the gradual varying or shift of intensity or color of the light emitted by the LED. A traditional dimmer may vary the voltage or current applied to a standard LED to adjust the light intensity of the light emitted from the LED, but may not have an effect on the color temperature. Sunlight and light from incandescent lamps dim to warmer colors, which is experienced by users as natural and comfortable. Typical mechanisms for dimming of white LEDs, such as white pc-LEDs, do not lead to a warmer color (i.e., lower correlated color temperature (CCT)) if the LED is driven at low current). Dimming LED light to warmer colors may be achieved using a fraction of warmer white LEDs in a light module comprising multiple CCT LEDs (e.g., chip-on-board (COB) LEDs), but this brings complications in the driving electronics and light distribution as well as increasing cost. Thus, there is a desire for an LED with a passive layer or structure that can modulate the color temperature on dimming towards warmer colors.

LED structures are disclosed herein that use combinations of different phosphors in a wavelength converting structure to control color shift as a function of changes in light scattering in an adjacent scattering structure or integral structure to provide a dim to warm effect on the light emitted from the LED structure as a function of LED temperature and drive current by varying the light color temperature from a cool white color to a warm white color. For example, where the light emitted from the LED structure is white light, the disclosed LED structure may provide a dimming effect on the light that varies the light color temperature from cool white (e.g., correlated color temperature (CCT) around 3000K or greater) at high drive current to warm white (e.g., CCT around 2000K) at lower drive current. While examples described herein may refer to white LED structures producing white light, it is understood by one skilled in the art that the embodiments disclosed herein may be similarly used to provide a dimming effect to LED structures producing any other color of light in the spectrum.

In embodiments disclosed herein, the phosphor system used in the wavelength converting structure includes at least a red phosphor (that absorbs green/blue light) and a green phosphor (that emits green light) such that the types of phosphors may be used to adjust overlap between green emission and absorption by the red phosphor to correspondingly adjust scattering and magnitude of color shift. As the overlap between green emission and red absorption in the phosphor system increases, the resulting color shift increases. Thus, maximizing the overlap between green emission and red absorption in the phosphor system maximizes the color shift and dimming range for the resulting white light emitted from the LED structure.

In the following examples, LED device is used to refer a white-appearing LED (unless otherwise indicated) and may be used interchangeably with LED, pc-LED, LED structure, LED module, light-emitting device, or (white) light source, such that an LED light source or any other type of light source may be similarly used in a light-emitting device. The disclosed embodiments for a light-emitting device with light scatter tuning to control color shift and color temperature may be used for illumination type LED modules that can be dimmed, which is typically useful in a hospitality setting or for applications at home, for example. Examples of LED types may include mid-power LEDs in a chip-on-board (COB) configuration.

FIG. 1A is a diagram of an example light-emitting device 100 that includes a light emitting semiconductor structure 115, a wavelength converting structure 110, and a light scattering structure 105. Light scattering structure 105 may be a separate structure as shown in FIG. 1A, or alternatively may be incorporated into wavelength converting structure 110. Contacts 120 and 125 may be coupled to the light emitting semiconductor structure 115, either directly or via another structure such as a submount, for electrical connection to a circuit board or other substrate or device. In an example, the contacts 120 and 125 may be electrically insulated from one another by a gap 127, which may be filled with a dielectric material. The light emitting semiconductor structure 115 may be any light emitting semiconductor structure that emits light 102 that may be converted to light 112 (e.g., a white-appearing light that comprises a combination of light 102 and light 104) having a different color point via a wavelength conversion structure 110 and/or light scattering structure 105. An example of such a light emitting semiconductor structure 115 may be formed from III-nitride light emitting semiconductor structure that emits blue light (e.g., wavelength of 450-495 nm) or ultraviolet (UV) light (e.g., wavelength of 400 nm or less), such as a light emitting semiconductor structure formed from one or more of binary, ternary, and quaternary alloys of gallium, aluminum, indium, and nitrogen. Other examples of light emitting semiconductor structures may include light emitting semiconductor structures formed from other groups of III-V materials, III-phosphide materials, III-arsenide materials, II-VI materials, zinc oxide (ZnO), or Silicon (Si)-based materials.

For example, the light emitting semiconductor structure 115 may be formed from III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors have indices of refraction ranging from about 2.4 to about 4.1 at the typical emission wavelengths of LEDs in which they are present. For example, III-Nitride semiconductors, such as GaN, have refractive indices of about 2.4 at 500 nm, and III-Phosphide semiconductors, such as InGaP, have refractive indices of about 3.7 at 600 nm. Contacts 120 and 125 may be formed from a solder, such as AuSn, AuGa, AuSi or SAC solders.

FIG. 1B is a diagram of an example light emitting semiconductor structure 115 that may be included in the light-emitting device 100 of FIG. 1A. The illustrated example is a flip chip structure. However, one of ordinary skill in the art will understand that the embodiments described herein may be applied to other types of LED designs, such as vertical, lateral, and multi-junction devices.

In the example illustrated in FIG. 1B, the light emitting semiconductor structure 115 includes a light emitting active region 135 disposed between a semiconductor layer or region of n-type conductivity (also referred to as an n-type region) 130 and a semiconductor layer or region of p-type conductivity (also referred to as a p-type region) 140. Contacts 145 and 150 are disposed in contact with a surface of the light emitting semiconductor structure 115 and electrically insulated from one another by a gap 155, which may be filled by a dielectric material, such as an oxide or nitride of silicon (i.e., $SiO_2$ or $Si_3N_4$). In the illustrated embodiment, contact 145 (also referred to as a p-contact) is in direct contact with a surface of the p-type region 140, and the contact 150 (also referred to as an n-contact) is in direct contact with a surface of the n-type region 130. Although not shown in FIG. 1B, a dielectric material, such as disposed in the gap 155, may also line side walls of the light emitting active region 135 and p-type region 140 to electrically insulate those regions from the contact 150 to prevent shorting of the p-n junction.

The n-type region 130 may be grown on a growth substrate and may include one or more layers of semiconductor material. Such layer or layers may include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Like the n-type region 130, the p-type region 140 may include multiple layers of different composition, thickness, and dopant concentrations, including layers that are not intentionally doped, or n-type layers. While layer 130 is described herein as the n-type region and layer 140 is described herein as the p-type region, the n-type and p-type regions could also be switched without departing from the scope of the embodiments described herein.

The light emitting active region 135 may be, for example, a p-n diode junction associated with the interface of p-region 140 and n-region 135. Alternatively, the light emitting active region 135 may include one or more semiconductor layers that are doped n-type or p-type or are un-doped. For example, the light emitting active region 135 may include a single thick or thin light emitting layer. This includes a homojunction, single heterostructure, double heterostructure, or single quantum well structure. Alternatively, the light emitting active region 135 may be a multiple quantum well light emitting region, which may include multiple quantum well light emitting layers separated by barrier layers.

The p-contact 145 may be formed on a surface of the p-type region 140. The p-contact 145 may include multiple conductive layers, such as a reflective metal and a guard metal, which may prevent or reduce electromigration of the reflective metal. The reflective metal may be silver or any other suitable material, and the guard metal may be TiW or TiWN. The n-contact 150 may be formed in contact with a surface of the n-type region 130 in an area where portions of the active region 135, the n-type region 140, and the p-contact 145 have been removed to expose at least a portion of the surface of the n-type region 130. The sidewall of the exposed mesa or via may be coated with a dielectric to prevent shorting. The contacts 145 and 150 may be, for example, metal contacts formed from metals including, but not limited to, gold, silver, nickel, aluminum, titanium, chromium, platinum, palladium, rhodium, rhenium, ruthenium, tungsten, and mixtures or alloys thereof. In other examples, one or both contacts 145 and 150 may be formed from transparent conductors, such as indium tin oxide.

The n-contact 150 and p-contact 145 are not limited to the arrangement illustrated in FIG. 1B and may be arranged in any number of different ways. In embodiments, one or more n-contact vias may be formed in the light emitting semiconductor structure 115 to make electrical contact between the n-contact 150 and the n-type layer 130. Alternatively, the n-contact 150 and p-contact 145 may be redistributed to form bond pads with a dielectric/metal stack as known in the art. The p-contact 145 and the n-contact 150 may be electrically connected to the contacts 120 and 125 of FIG. 1A, respectively, either directly or via another structure, such as a submount.

With reference to FIG. 1A, the wavelength conversion structure 110 may be any luminescent material, such as a phosphor or phosphor particles in a transparent or translucent binder or matrix such as silicone, or a ceramic phosphor element, which absorbs light of one wavelength and emits light of a different wavelength. If the wavelength converting material 110 is a ceramic phosphor element, the ceramic phosphor element may be, for example, a ceramic phosphor plate, such as platelet(s) of phosphor, for generating one color of light, or a stack of ceramic phosphor plates for generating different colors of light. The ceramic phosphor plate may have an RI of 1.4 or greater (e.g., 1.7 or greater) at the wavelengths emitted by the light emitting semiconductor structure 115. In an example, the wavelength conversion structure 110 may be pre-formed into a wavelength conversion element and attached to the light emitting semiconductor structure 115 using an adhesive or any other method or material known in the art.

In an example, the light emitting semiconductor structure 115 may emit blue light 102. In such embodiments, the wavelength conversion structure 110 may include, for example, a yellow emitting wavelength conversion material (e.g., yellow phosphor) or green and red emitting wavelength conversion materials (e.g., a combination of red and green phosphors), which will produce white light 112 when the light 104 emitted by the respective phosphors combines with the blue light 102 emitted by the light emitting semiconductor structure 115. In another example, the light emitting semiconductor structure 115 may emit UV light. In such embodiments, the wavelength conversion structure 110 may include, for example, blue and yellow wavelength converting materials or blue, green and red wavelength converting materials. Wavelength converting materials emitting other colors of light may be added to tailor the spectrum of light 112 emitted from the light-emitting device 100.

The wavelength converting structure 110 may include phosphor particles, organic semiconductors, II-VI or III-V semiconductors, II-VI or III-V quantum dots or nanocrystals, dyes, polymers, or materials such as gallium nitride (GaN) that luminesce. Examples of phosphors that may be used include combinations of garnet-based, orthosilicate, nitridosilicate, and nitridoaluminate phosphors, such as garnets $Y_3Al_5O_{12}$:Ce (YAG), $Lu_3Al_5O_{12}$:Ce (LuAG), $Y_3Al_{5-x}Ga_xO_{12}$:Ce (YGaG), orthosilicate $(Ba_{1-x}Sr_x)_2SiO_4$:Eu (BOSE), and nitridosilicate phosphors, such as (Ca,Sr)AlSiN$_3$:Eu (ECAS or SCASN), $(Ca,Sr,Ba)_2Si_5N_8$:Eu (BSSN), and $Sr(LiAl_3N_4)$:Eu (SLA).

In an example, the light scattering structure 105 may be applied to light-emitting device 100 to achieve an off-state white appearance, as described in U.S. patent application Ser. No. 15/722,903, which is incorporated by reference as if fully set forth herein.

FIG. 1C is a diagram of an example layer of scattering structure 105 that may be included in the light-emitting device 100 of FIG. 1A. The scattering structure 105 may be formed from a plurality of scattering particles 160 dispersed in an matrix material 165 that is an otherwise homogeneous material. For example, the matrix material 165 may be silicone or any transparent or near transparent material, or a temperature and light resistant matrix, such as a silicone matrix. A property of the matrix material 165 (e.g., silicone matrix) is that the refractive index (RI) changes strongly with temperature. The scattering particles 160 are made of material(s) with a different RI (e.g., a lower RI) than the matrix material 165 to provide scattering modulation. In other words, the difference in RI between the matrix material 165 and the scattering particles 160 disposed therein affects the magnitude of color point shift achievable in the white light 112. In an example, (porous or non-porous) silica ($SiO_2$) and/or (porous or non-porous) magnesium fluoride ($MgF_2$) may be included in the material of the scattering particles 160. For example, a porous $SiO_2$ or a non-porous $MgF_2$ may be used. In an alternative embodiment not shown in the FIGS. 1A and 1C, the scattering particles 160 may be included in the wavelength converting structure 110.

As the temperature of the light-emitting device 100 increases by applying a higher drive current, the silicone filled porous silica material 160 in the scattering structure 105 becomes more transparent, the amount of scattering of the light 104 emitted from the wavelength conversion material 110 reduces. The amount of scattering of light 102 emitted from the light emitting semiconductor structure 115 is also reduced resulting in more light 102 and less light 104 comprised in light 112 as temperature and current are increased. This change in scattering and light as a function of temperature acts as a passive color temperature regulating system as the temperature is determined by the drive current. Because the scattering caused by the scattering structure 105 in this case decreases with increasing temperature, the direction of the color point shift shifts to cooler colors (higher CCT) as the temperature is increased. Thus, the scattering structure 105 enables a passive dimming setting where the color point shift is controlled by the drive current without additional input needed, and where the color point of the resulting white light 112 shifts from warmer colors to cooler colors when current is increased. In an alternate example, different materials may be used in the scattering structure 105 so that the scattering of light increases with temperature. In an example, when titanium dioxide is used as the scattering particles 160 in a matrix material 165, the scattering of light caused by the scattering structure 105 increases with temperature because the refractive index difference between the scattering particles 160 and the silicone matrix materials 165 increases with temperature.

In embodiments, the scattering structure 105 may be formed into a layer or film having a thickness, $t_1$. In an example, the thickness, $t_1$, may be chosen to optimize the switching speed of the phase changing material and/or the physical space taken up by the scattering structure 105 in the light emitting semiconductor structure 115. In an example, the thickness $t_1$ may be between 50 μm to 300 μm.

As explained above, the magnitude of the scattering effect on light 104 by the scattering structure 105, and thus the magnitude of color point shift achievable in the white light 112, depends in part on the concentration of the scattering particles 160 and on the RI difference between the scattering particles 160 and the matrix material 165.

Another aspect that determines the magnitude of color point shift achievable in the white light 112 is the mixture of phosphors used in the wavelength converting structure 110. Tuning the absorption spectra as well as the emission spectra of the combination of phosphors in the wavelength converting structure 110 is used to control the magnitude of color point shift of light 112 by increasing the range of scattering in the scattering structure 105. Phosphors may be solid inorganic materials consisting of a host lattice doped with impurities. The impurities in the host lattice may absorb energy of the excitation light and emit light of a different wavelength. According to the disclosures herein, overlapping absorption spectra and emission spectra of the different phosphors in the wavelength converting structure 110 may be used to diminish the relative contribution of certain emission spectra while increasing the relative contribution of certain other emission spectra, as described below.

Figure 1D:
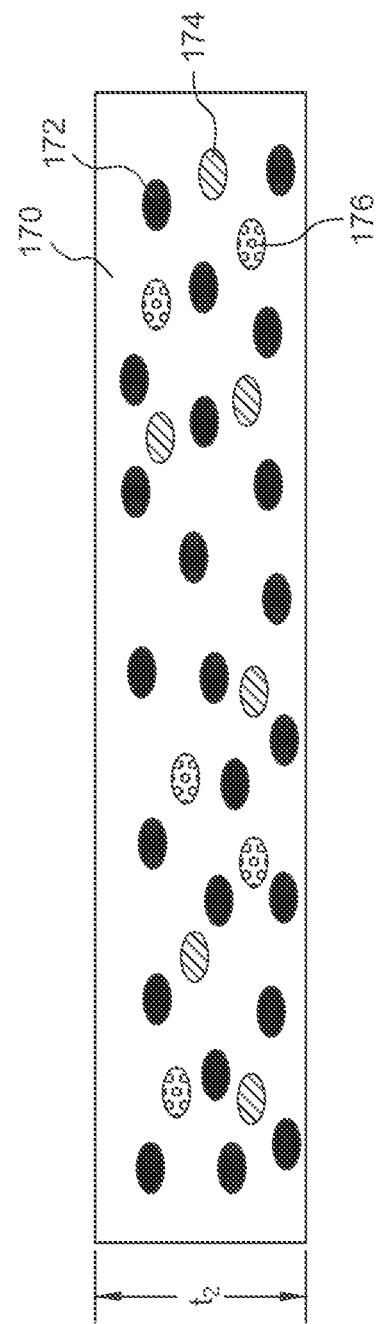
FIG. 1D is a diagram of an example layer of wavelength converting structure that may be included in the light-emitting device of FIG. 1A.

FIG. 1D is a diagram of an example layer of wavelength converting structure 110 that may be included in the light-emitting device 100 of FIG. 1A. The wavelength converting structure 110 may be formed as a mixture of one or more phosphors (e.g., two or three types of phosphor) in a matrix (binder) material 170, which may be, for example, silicone resin or any transparent or near transparent material, or a temperature and light resistant matrix, such as a silicone matrix. As a result of the mixture, different types of phosphor particles 172, 174, 176 that absorb and emit different types of light are disposed in the matrix material 170. Alternatively, wavelength converting structure 110 may be one or more platelets of ceramic phosphor stacked together with or without intervening layers. In an example, the wavelength converting structure 110 may include both a ceramic phosphor and a silicone matrix with one or more types of phosphor particles in combination. In another example, the wavelength converting structure 110 may include a ceramic plate of a first type of phosphor material and a matrix with phosphor particles in the optical path of the ceramic plate.

In the example shown in FIG. 1D, the wavelength converting structure 110 includes three types of phosphor particles: narrowband red-emitting phosphor particles 172 that absorb blue and green light and emit red light; broad red-emitting phosphor particles 174 that absorb blue light and some green light (e.g., light in the wavelength range of 400 nm-580 nm) and emit red light (e.g., longer than 580 nm, 600 nm, or 620 nm); and green-emitting phosphor that absorbs blue light and some green light and emits green light. The narrow red-emitting phosphor absorbs green light emitted from the green-emitting phosphor better than the broad red-emitting phosphor.

In an alternative embodiment not shown in the FIGS. 1A and 1C, the scattering particles 160 may be included in the wavelength converting structure 110. In this case, for example, scattering particles 160 may be incorporated in the wavelength converting material 110 at the same time that phosphor particles 172, 174, and 176 are incorporated.

The wavelength conversion structure 110 may be applied in a layer having a thickness $t_2$ that may depend on the wavelength conversion material used and/or the LED design. For example, a layer of wavelength conversion structure 110 may be approximately $t_2=500$ μm in thickness while other wavelength conversion materials may be formed in layers as thin as 20 μm or as thick as 1000 μm. In an example where the light emitting device is implemented in a COB design, the thickness $t_2$ may be greater, for example in the 400 μm to 600 μm range. In COB designs, the wavelength conversion structure 110 may be concave or convex, which may lead to local deviations in the thickness $t_2$.

Figure 2:
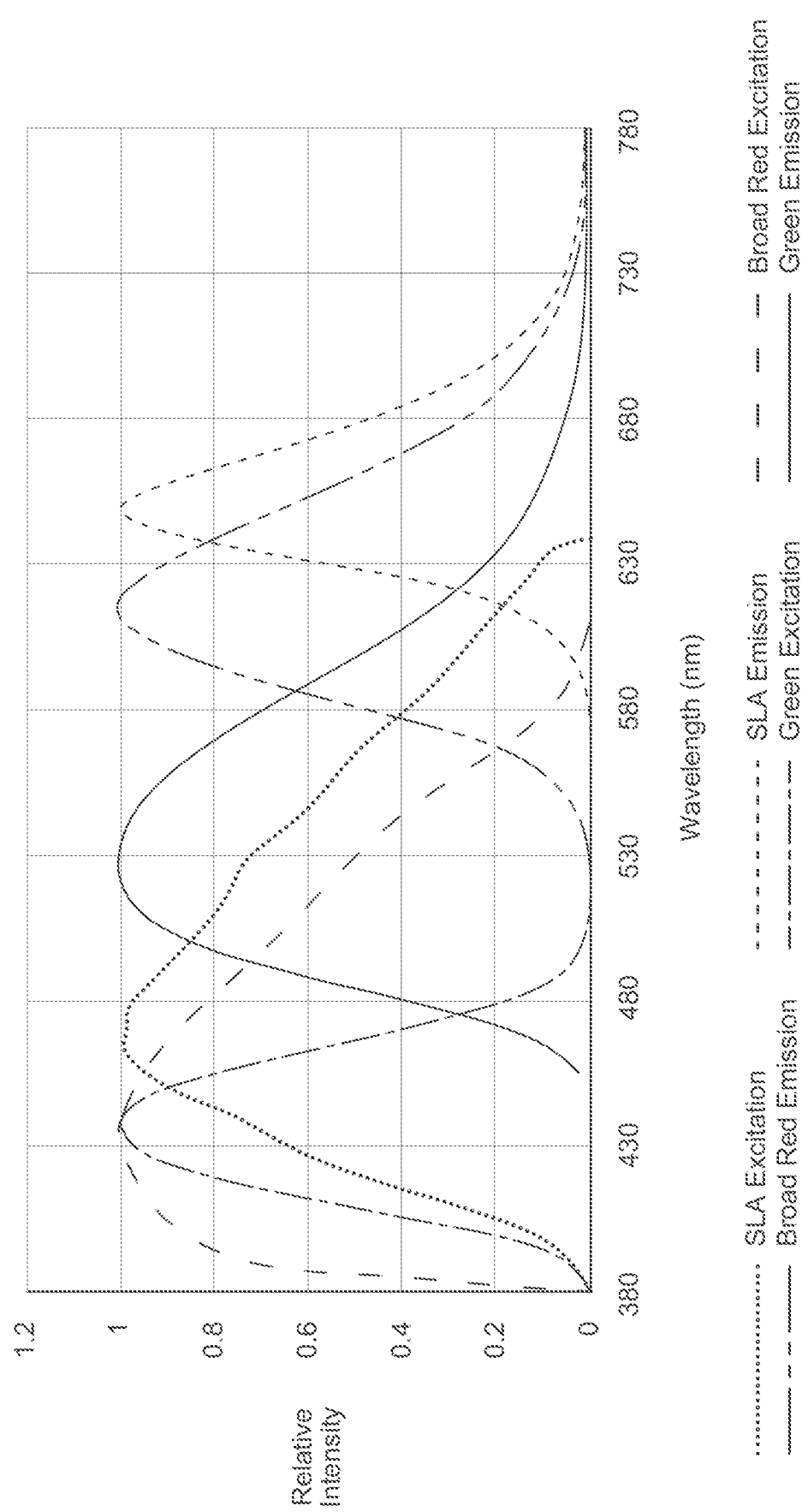
FIG. 2 is a spectral diagram of the relative intensities, shown normalized in arbitrary units (a.u.), versus wavelength of the excitation spectrum and emission spectra of three types of phosphor.

FIG. 2 is a spectral diagram of the relative intensities (shown normalized in arbitrary units (a.u.)) versus wavelength of the excitation (absorption excites an electron to a higher energy state) spectrum and emission spectra of three types of phosphor: SLA phosphor $Sr(LiAl_3N_4):Eu^{2+}$, which is a narrow-band red-emitting phosphor; broad red phosphor such as $(Ca,Sr)AlSiN_3:Eu^{2+}$ or $(Ga,Sr,Ba)_2Si_5N_8:Eu^{2+}$; and green phosphor such as $(Lu,Y)_3(Al,Ga)_5O_{12}:Ce^{3+}$ or $(Ba,Sr)_2SiO_4:Eu^{2+}$. As observed from the spectra in FIG. 2, the SLA narrow red-emitting phosphor may have strong absorption in the blue and green wavelengths, with a maximum absorption for wavelengths between around 450 nm and 500 nm (maximum around 470 nm), and a full width at half maximum (FWHM, the width of the spectrum curve as the distance between points on the curve at which the function reaches half its maximum value) of approximately 150 nm, tailing to long wavelengths with a slow decrease to around 600 nm. The broad red phosphor absorption may have a maximum at a shorter wavelength of around 435 nm and absorbs more in the blue range and less in the green.

As seen in FIG. 2, a red phosphor or red phosphor combination can effectively absorb wavelengths in the blue and green wavelength range, for example between 400 nm and 580 nm. A light emitting semiconductor structure 115 that is a blue LED may have little emission shorter than 430 nm, so the absorption range may be narrowed based on the wavelength ranges of the incoming light. Emission by the red phosphors may occur for wavelengths at least longer than 580 nm, or at or longer than 600 nm or 620 nm.

As can be seen from FIG. 2, the long wavelength tail of the excitation spectra in many cases overlaps with the short wavelength head of the emission spectra. The area of overlap between the SLA phosphor excitation spectrum and the green phosphor emission spectrum is proportionate to the amount of green emission absorbed by the SLA phosphor and thus proportionate to the amount of green light converted into red light.

Thus, the greater overlap between the SLA phosphor excitation spectrum and the green phosphor emission spectrum for the phosphors in the wavelength converting structure 110 implies that as the scattering (transparency) in the scattering layer 105 increases (or alternatively as the scattering in the wavelength converting structure 110, including scattering particles, increases) by decreasing the temperature and drive current of the light-emitting device 100, more green emission is absorbed by red phosphor thus providing a greater shift in color point of light 112 with a given dimming range. Accordingly, the amounts (ratios) of the different phosphors (e.g., green, broad red and narrow red phosphors) in the phosphor mixture may be varied to obtain the desired color point shift and dimming range. For example, a phosphor mixture having a relatively high amount of narrow red phosphor will produce a larger color point shift over the dimming range with the resulting light 112 having a greater dim to warm effect.

In the following example, with reference to FIG. 1A, it is assumed that the light scattering structure 105 becomes more transparent as the temperature of the light-emitting device 100 increases when the light-emitting device 100 is turned on, for example using porous silica or $MgF_2$ in a silicone matrix as described above. It is also assumed that the wavelength converting structure 110 includes a mixture of a silicone resin with three types of phosphor: SLA phosphor, broad red phosphor, and green phosphor. The temperature of the light-emitting device 100 depends on the drive current that flows through the light emitting semiconductor structure 115. The temperature and drive current may be controlled choosing an appropriate heat sink, for example. In some LED applications, it is desirable to keep the temperature as low as possible to have an optimal output of the LED. Nevertheless, at high drive currents, the temperature of an LED can heat up to high temperatures, at or above 100° C. The temperature can be increased further by using a smaller heat sink. If the scattering structure 105 is incorporated in the wavelength converting layer 110, for example by incorporating porous silica or $MgF_2$ particles in wavelength converting layer 110 along with phosphor particles, then the scattering and color conversion both increase at lower operating current and temperature to produce a warmer white light.

When the light-emitting device 100 is in the on state but operating at a lower temperature, for example close to room temperature (e.g., around 25° C., where the operating current applied to the light-emitting device 100 may be approximately 30 mA), the light scattering structure 105 is opaque/white and thus has a higher scattering effect on the light 104 coming from the combination of the wavelength converting structure 110 and light 102 emitted from light-emitting semiconductor structure 115. In this case, the light scattering structure 105 reflects the light 102 and 104 back into the wavelength converting structure 110, and the narrow red phosphor (e.g., SLA phosphor) in the wavelength converting structure 110 absorbs blue and green light while emitting red light from the reflected light, which diminishes the blue and green light peaks in the white light 112 and increases the red peak. This changes the color point of the white light 112 to a warmer tone (e.g., 2000K-2200K CCT, or generally 1500K-2500K). As the temperature of the light-emitting structure increases (e.g., to 85° C., where the operating current applied to the light-emitting device 100 may be approximately 250 mA), the light scattering structure 105 becomes more transparent and reduces the scattering effect of emitted light 102 and 104. As a result, less of the light 102 and 104 is reflected back to the wavelength converting structure 110 such that the SLA phosphor absorbs less reflected blue and green light, which allows more blue and green relative to red emission in the white light 112 and changes the color point of the white light 112 to a cooler tone (e.g., 2700K CCT or higher).

Figure 3:
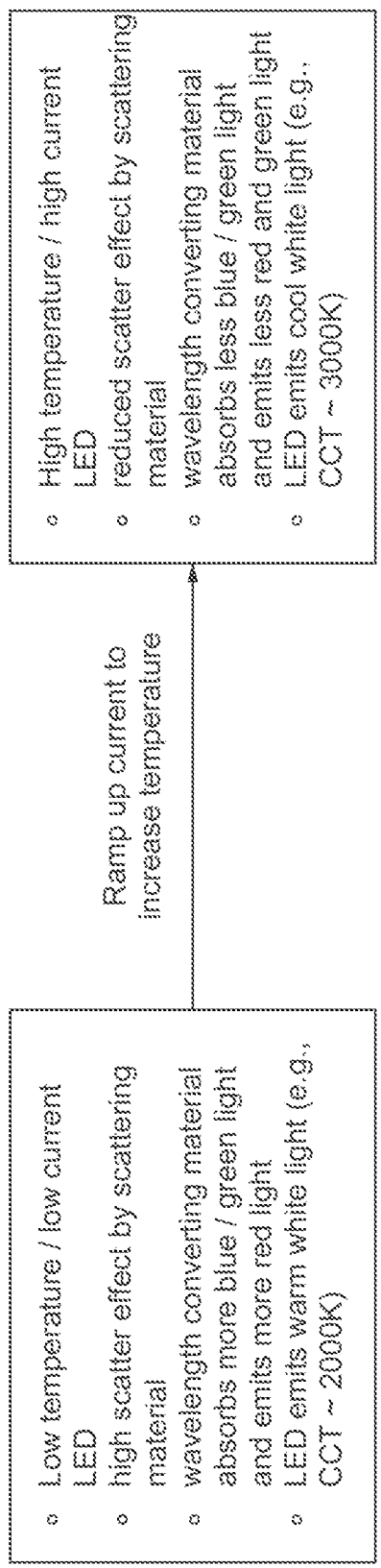
FIG. 3 is a diagram illustrating dimming effect of light emitted from the light-emitting device that can be achieved by varying the drive current leading to temperature changes.

Thus, a dimming effect of the light 112 emitted from the light-emitting device 100 can be achieved by varying the drive current leading to temperature changes from low device temperatures/current to high device temperature/current to correspondingly shift the color point in the light 112 color temperature from warm white (smaller CCT) to cool white (larger CCT), as illustrated in FIG. 3. The range of the dimming effect (i.e., color point shift) can be increased by increasing the overlap between the SLA phosphor excitation spectrum and the green phosphor emission spectrum, as described above.

Figure 4:
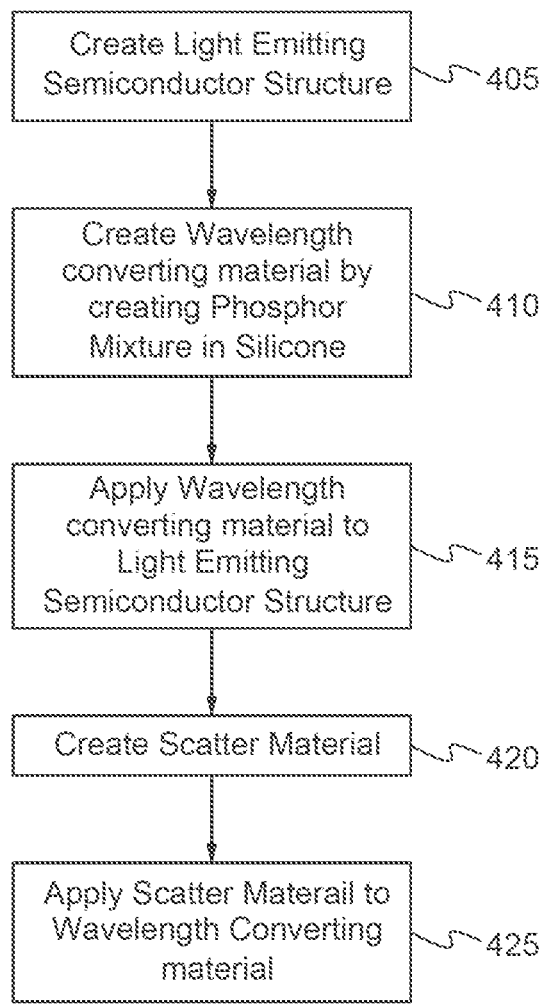
FIG. 4 is a flow diagram of an example method of manufacturing a light-emitting device with light scatter tuning to control color shift, such as the light-emitting device of FIG. 1A.

FIG. 4 is a flow diagram of an example method 400 of manufacturing a light-emitting device with light scatter tuning to control color shift, such as the light-emitting device 100 of FIG. 1A. The example method 400 includes creating the light emitting semiconductor structure 115 (405). The light emitting semiconductor structure may be created, for example, by growing the light emitting semiconductor structure, such as a III-nitride semiconductor structure, on a growth substrate, such as sapphire, SiC, Si, GaN or a composite substrate.

The example method 400 illustrated in FIG. 4 further includes creating the wavelength converting material by creating a phosphor mixture in silicone (410). As described above, the phosphor mixture includes at least two types of phosphor, and may include narrowband SLA phosphor, broad red-emitting phosphor, and/or green phosphor.

The example method 400 illustrated in FIG. 4 further includes applying the wavelength converting material 110 to the light emitting semiconductor structure 115 (415). In an example, the wavelength converting material 110 may be a layer or film that is, for example, spray deposited, spun-on, thin-film deposited (e.g., by electrophoresis), or molded. To create the wavelength converting material 110, phosphors (e.g., narrow red phosphor, broad red phosphor, and/or green phosphor) may be mixed at a ratio in silicone to achieve a desired color point shift. In the case of a COB design, the wavelength converting material 110 may be applied on the COB (e.g., by dispense or spray), followed by curing. Ceramic platelets of the various phosphors could also be used to form wavelength converting structure 110.

The example method 400 illustrated in FIG. 4 further includes creating the scatter material 105 (420) and applying it to the wavelength converting material 110 (425). This may be done using any method known in the art, such as mixing followed by an application technique. The scatter material 105 may be created by mixing scattering particles 160, such as porous silica or $MgF_2$, in an matrix material 165 with higher RI such as a silicone matrix. The scatter material 105, including the matrix material 165 and the scattering particles 160, may be laminated to the wavelength converting material 110. For example, the scatter material 105 may be incorporated in and/or molded directly over the wavelength converting material 110. In an alternative example, the creation of the wavelength converting material (410) and the creation of scatter material (420) may be a combined step where the materials are combined.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light-emitting device configured to produce a white light comprising:
   a light emitting semiconductor structure configured to emit blue light;
   a wavelength converting structure disposed in a path of the light emitted by the light emitting semiconductor structure and comprising a green phosphor material, a broad red phosphor material, and a narrow red phosphor material; and
   a light scattering structure arranged with respect to the wavelength converting structure to scatter light back toward the wavelength converting structure; the light scattering structure configured to scatter more light as the temperature of the light scattering structure increases;
   in operation with the light scattering structure at 25° C., the white light output of the light-emitting device has a correlated color temperature of less than 2500K and with the light scattering structure at 85° C., the white light output of the light-emitting device has a correlated color temperature of greater than 2700K.

2. The light-emitting device of claim 1 wherein the green phosphor material comprises $(Lu,Y)_3 (Al,Ga)_5O_{12}:Ce^{3+}$ or $(Ba,Sr)_2SiO_4:Eu^{2+}$.

3. The light-emitting device of claim 1, wherein the narrow red phosphor material comprises SLA phosphor $Sr(LiAl_3N_4):Eu^{2+}$.

4. The light-emitting device of claim 1, wherein the broad red phosphor material comprises $(Ca,Sr)AlSiN_3:Eu^{2+}$ or $(Ga,Sr,Ba)_2Si_5N_8:Eu^{2+}$.

5. The light-emitting device of claim 1, wherein
   the green phosphor material comprises $(Lu,Y)_3 (Al,Ga)_5O_{12}:Ce^{3+}$ or $(Ba,Sr)_2SiO_4:Eu^{2+}$;
   the narrow red phosphor material comprises SLA phosphor $Sr(LiAl_3N_4):Eu^{2+}$; and
   the broad red phosphor material comprises $(Ca,Sr)AlSiN_3:Eu^{2+}$ or $(Ga,Sr,Ba)_2Si_5N_8:Eu^{2+}$.

6. The light-emitting device of claim 1, wherein the second material of the light scattering structure comprises silicone and the first material of the light scattering structure comprises $MgF_2$.

7. The light-emitting device of claim 1, wherein the second material of the light scattering structure comprises silicone and the first material of the light scattering structure comprises porous silica.

8. The light-emitting device of claim 1, wherein the light scattering structure comprises a plurality of scattering particles of a first material having a first index of refraction $n_1$ dispersed in a second material having a second index of refraction $n_2$, $(n_2-n_1)$ having a larger magnitude at 25° C. than at 85° C., and
   a concentration of scattering particles in the second material and a change in the value of $(n_2-n_1)$ between 25° C. and 85° C. such that in operation with the light scattering structure at 25° C., the white light output of the light-emitting device has a correlated color temperature of less than 2500K and with the light scattering structure at 85° C., the white light output of the light-emitting device has a correlated color temperature of greater than 2700K.

9. The light emitting device of claim 1, wherein
   the narrow red phosphor material comprises SLA phosphor $Sr(LiAl_3N_4):Eu^{2+}$; and
   the broad red phosphor material comprises $(Ca,Sr)AlSiN_3:Eu^{2+}$ or $(Ga,Sr,Ba)_2Si_5N_8:Eu^{2+}$.

10. The light emitting device of claim 1, wherein in operation with the light scattering structure at 25° C., the white light output of the light-emitting device has a correlated color temperature of about 2000K and with the light scattering structure at 85° C., the white light output of the light-emitting device has a correlated color temperature of greater than 3000K.

11. The light emitting device of claim 1, wherein in operation with the light scattering structure at 25° C., the white light output of the light-emitting device has a correlated color temperature between 2000K and 2200K and with the light scattering structure at 85° C., the white light output of the light-emitting device has a correlated color temperature of greater than 2700K.

12. The light emitting device of claim 1, wherein in operation with the light scattering structure at 25° C., the white light output of the light-emitting device has a correlated color temperature between 1500K and 2500K and with the light scattering structure at 85° C., the white light output of the light-emitting device has a correlated color temperature of greater than 2700K.

13. A light-emitting device configured to produce a white light comprising:
   a light emitting semiconductor structure configured to emit blue light when a drive current is applied to the light emitting semiconductor structure;
   a wavelength converting structure disposed in a path of the light emitted by the light emitting semiconductor structure and comprising a green phosphor material, a broad red phosphor material, and a narrow red phosphor material;
   a light scattering structure arranged with respect to the wavelength converting structure to scatter light back toward wavelength converting structure; the light scattering structure configured so that as the drive current is increased the light scattering structure scatters more light;
   in operation when a drive current of approximately 30 mA is applied to the light emitting semiconductor structure, the white light output of the light-emitting device has a correlated color temperature of less than 2500K and when a drive current of approximately 250 mA is applied to the light emitting semiconductor structure, the white light output of the light-emitting device has a correlated color temperature of greater than 2700K.

14. The light-emitting device of claim 13 wherein the green phosphor material comprises $(Lu,Y)_3 (Al,Ga)_5O_{12}:Ce^{3+}$ or $(Ba,Sr)_2SiO_4:Eu^{2+}$.

15. The light-emitting device of claim 13, wherein the narrow red phosphor material comprises SLA phosphor $Sr(LiAl_3N_4):Eu^{2+}$.

16. The light-emitting device of claim 13, wherein the broad red phosphor material comprises $(Ca,Sr)AlSiN_3:Eu^{2+}$ or $(Ga,Sr,Ba)_2Si_5N_8:Eu^{2+}$.

17. The light-emitting device of claim 13, wherein
   the green phosphor material comprises $(Lu,Y)_3 (Al,Ga)_5O_{12}:Ce^{3+}$ or $(Ba,Sr)_2SiO_4:Eu^{2+}$;
   the narrow red phosphor material comprises SLA phosphor $Sr(LiAl_3N_4):Eu^{2+}$; and
   the broad red phosphor material comprises $(Ca,Sr)AlSiN_3:Eu^{2+}$ or $(Ga,Sr,Ba)_2Si_5N_8:Eu^{2+}$.

18. The light emitting device of claim 13, wherein in operation when the drive current is approximately 30 mA, the white light output of the light-emitting device has a correlated color temperature between 2000K and 2200K and when the drive current is 250 mA, the white light output of the light-emitting device has a correlated color temperature of greater than 2700K.

19. The light emitting device of claim 13, wherein in operation when the drive current is approximately 30 mA, the white light output of the light-emitting device has a correlated color temperature between 1500K and 2500K and when the drive current is approximately 250 mA, the white light output of the light-emitting device has a correlated color temperature of greater than 2700K.

20. A light-emitting device configured to produce a white light comprising:
- a light emitting semiconductor structure configured to emit blue light;
- a wavelength converting structure disposed in a path of the light emitted by the light emitting semiconductor structure and comprising a first phosphor material configured to emit green light, a second phosphor material configured to emit red light, and a third phosphor material comprising SLA phosphor $Sr(LiAl_3N_4):Eu^{2+}$; and
- a light scattering structure arranged with respect to the wavelength converting structure to scatter light back toward the wavelength converting structure; the light scattering structure configured to scatter more light as the temperature of the light scattering structure increases;
- in operation with the light scattering structure at 25° C., the white light output of the light-emitting device has a correlated color temperature of less than 2500K and with the light scattering structure at 85° C., the white light output of the light-emitting device has a correlated color temperature of greater than 2700K.

* * * * *